(12) United States Patent
Jang

(10) Patent No.: US 7,546,497 B2
(45) Date of Patent: Jun. 9, 2009

(54) SEMICONDUCTOR MEMORY DEVICE AND DATA WRITE AND READ METHOD THEREOF

(75) Inventor: Seong-Jin Jang, Gyeonggi-do (KR)

(73) Assignee: Samsung Electronics Co., Ltd, Suwon-si, Gyeonggi-do (KR)

(*) Notice: Subject to any disclaimer, the term of this patent is extended or adjusted under 35 U.S.C. 154(b) by 455 days.

(21) Appl. No.: 11/419,155

(22) Filed: May 18, 2006

(65) Prior Publication Data
US 2006/0268624 A1 Nov. 30, 2006

(30) Foreign Application Priority Data
May 24, 2005 (KR) ............. 10-2005-0043754

(51) Int. Cl.
G11C 29/34 (2006.01)
G11C 29/50 (2006.01)
(52) U.S. Cl. ............... 714/718; 714/719; 714/744
(58) Field of Classification Search ............. None
See application file for complete search history.

(56) References Cited

U.S. PATENT DOCUMENTS

| 6,130,846 | A * | 10/2000 | Hori et al. ............. 365/203 |
| 6,373,784 | B2 * | 4/2002 | Maeda .............. 365/233.1 |
| 6,427,197 | B1 * | 7/2002 | Sato et al. ............. 711/169 |
| 6,765,976 | B1 * | 7/2004 | Oh .............. 375/376 |
| 6,978,402 | B2 * | 12/2005 | Hirabayashi ............. 714/42 |
| 2003/0070052 | A1 | 4/2003 | Lai .............. 711/167 |
| 2004/0257124 | A1 * | 12/2004 | Araki et al. ............. 327/101 |
| 2006/0031565 | A1 * | 2/2006 | Iyer et al. ............. 709/234 |

FOREIGN PATENT DOCUMENTS

| JP | 2002-015567 | 1/2002 |
| KR | 10-2004-0080784 | 9/2004 |
| KR | 2004-0095856 | 11/2004 |

OTHER PUBLICATIONS

English language abstract of Korea Publication No. 2004-0095856.
English language abstract of Japanese Publication No. 2002-015567.

* cited by examiner

*Primary Examiner*—Cynthia Britt
*Assistant Examiner*—Dipakkumar Gandhi
(74) *Attorney, Agent, or Firm*—Marger Johnson & McCollom, P.C.

(57) ABSTRACT

A semiconductor memory device includes a serial to parallel converter configured to generate parallel data at a parallel data rate in response to first serial data at first serial data rate in a first mode and configured to generate the parallel data at the parallel data rate in response to a second serial data at second serial data rate in a second mode, wherein the second serial data rate is less than the first serial data rate, and a data write circuit configured to provide the parallel data to a memory cell array.

31 Claims, 10 Drawing Sheets

SEMICONDUCTOR MEMORY DEVICE AND DATA WRITE AND READ METHOD THEREOF

CROSS-REFERENCE TO RELATED APPLICATION

This application claims the benefit of Korean Patent Application No. 2005-43754, filed May 24, 2005, the disclosure of which is hereby incorporated herein by reference in its entirety.

BACKGROUND

1. Technical Field

This disclosure relates to a semiconductor memory device and, more particularly, to a semiconductor memory device and data write and read method thereof which operates at a high frequency.

2. Description of the Related Art

An expensive test device is necessary to test a semiconductor memory device that may operate at a high frequency, specifically a device that may operate with a clock signal having a frequency in excess of 1 GHz. Such an expensive test device may be capable of generating a clock signal having a frequency greater than 1 GHz. Less expensive test devices may not be able to generate a clock signal having as high a frequency but may be able to receive data output from the semiconductor memory device at a high data rate. However, because of the lack of the ability to generate the high frequency clock signal, less expensive test devices may not be able to adequately test the semiconductor memory device capable of using the high frequency clock signal.

SUMMARY

An embodiment includes a semiconductor memory device including a memory cell array for writing and reading data, a clock signal generating means for receiving an external clock signal applied from an external portion to generate first and second clock signals which have the same phase and frequency as the external clock signal during a normal operation including a normal read operation and a normal write operation and to generate the first clock signal which has the same phase and frequency as the external clock signal and a second clock signal which has the same phase as and a higher frequency than the external clock signal during a test operation including a test read operation and a test write operation, a data write means for receiving a first predetermined-bit serial data applied at a first data rate and converting the first predetermined-bit serial data into a first predetermined-bit parallel data to be outputted to the memory cell array during the normal write operation and for receiving a second predetermined-bit serial data applied at the first data rate and converting the second predetermined-bit serial data into parallel data to be outputted to the memory cell array during the test write operation, and a data read means for generating a predetermined-bit parallel data outputted from the memory cell array in response to the first clock signal during the normal and test operations, converting the predetermined-bit parallel data into serial data and outputting the serial data at the first data rate in response to the second clock signal during the normal read operation, and converting the predetermined-bit parallel data into serial data and outputting the serial data at the second data rate in response to the second clock signal during the test read operation.

A further embodiment includes a semiconductor memory device including an address input means for receiving and buffering an address which are sequentially applied at least twice in response to a rising edge of an external clock signal applied from an external portion during a normal operation including a normal read operation and a normal write operation and for receiving and buffering an address which is sequentially applied at least twice in response to rising and falling edges of the external clock signal during a test operation including a test read operation and a test write operation, a memory cell array for writing and reading data in at least one cell which the address designates, a clock signal generating means for receiving the external clock signal to generate first and second clock signals which have the same phase and frequency as the external clock signal during the normal operation and to generate the first clock signal which has the same phase and frequency as the external clock signal and a second clock signal which has the same phase as and a higher frequency than the external clock signal during the test operation, and a data read means for generating a predetermined-bit parallel data outputted from the memory cell array in response to the first clock signal during the normal and test operations, converting the predetermined-bit parallel data into serial data and outputting the serial data at the first data rate in response to the second clock signal during the normal read operation, and converting the predetermined-bit parallel data into serial data and outputting the serial data at the second data rate in response to the second clock signal during the test read operation.

Another embodiment includes a method of operating a semiconductor memory device including generating step for receiving an external clock signal applied from an external portion to generate first and second clock signals which have the same phase and frequency as the external clock signal during a normal operation including a normal read operation and a normal write operation and to generate the first clock signal which has the same phase and frequency as the external clock signal and a second clock signal which has the same phase as and a higher frequency than the external clock signal during a test operation including a test read operation and a test write operation, receiving a first predetermined-bit serial data applied at a first data rate and converting the first predetermined-bit serial data into a first predetermined-bit parallel data to be outputted to the memory cell array during the normal write operation and for receiving a second predetermined-bit serial data applied at the first data rate and converting the second predetermined-bit serial data into parallel data to be outputted to the memory cell array during the test write operation; and generating a predetermined-bit parallel data outputted from the memory cell array in response to the first clock signal during the normal and test operations, converting the predetermined-bit parallel data into serial data and outputting the serial data at the first data rate in response to the second clock signal during the normal read operation, and converting the predetermined-bit parallel data into serial data and outputting the serial data at the second data rate in response to the second clock signal during the test read operation.

A further embodiment includes a method of testing a semiconductor memory device operable at a high data rate with a test instrument unable to generate data at the high data rate, including generating serial data in the test instrument at a low data rate, the low data rate being less than the high data rate, receiving the serial data in the semiconductor memory device over a time period, and generating parallel data in the semiconductor memory device in response to the serial data, the parallel data having a number of bits greater than a number of bits received by the semiconductor memory device during the time period.

BRIEF DESCRIPTION OF THE DRAWINGS

The above and other features and advantages will become more apparent to those of ordinary skill in the art by describing embodiments in detail with reference to the attached drawings in which.

Figure 1:
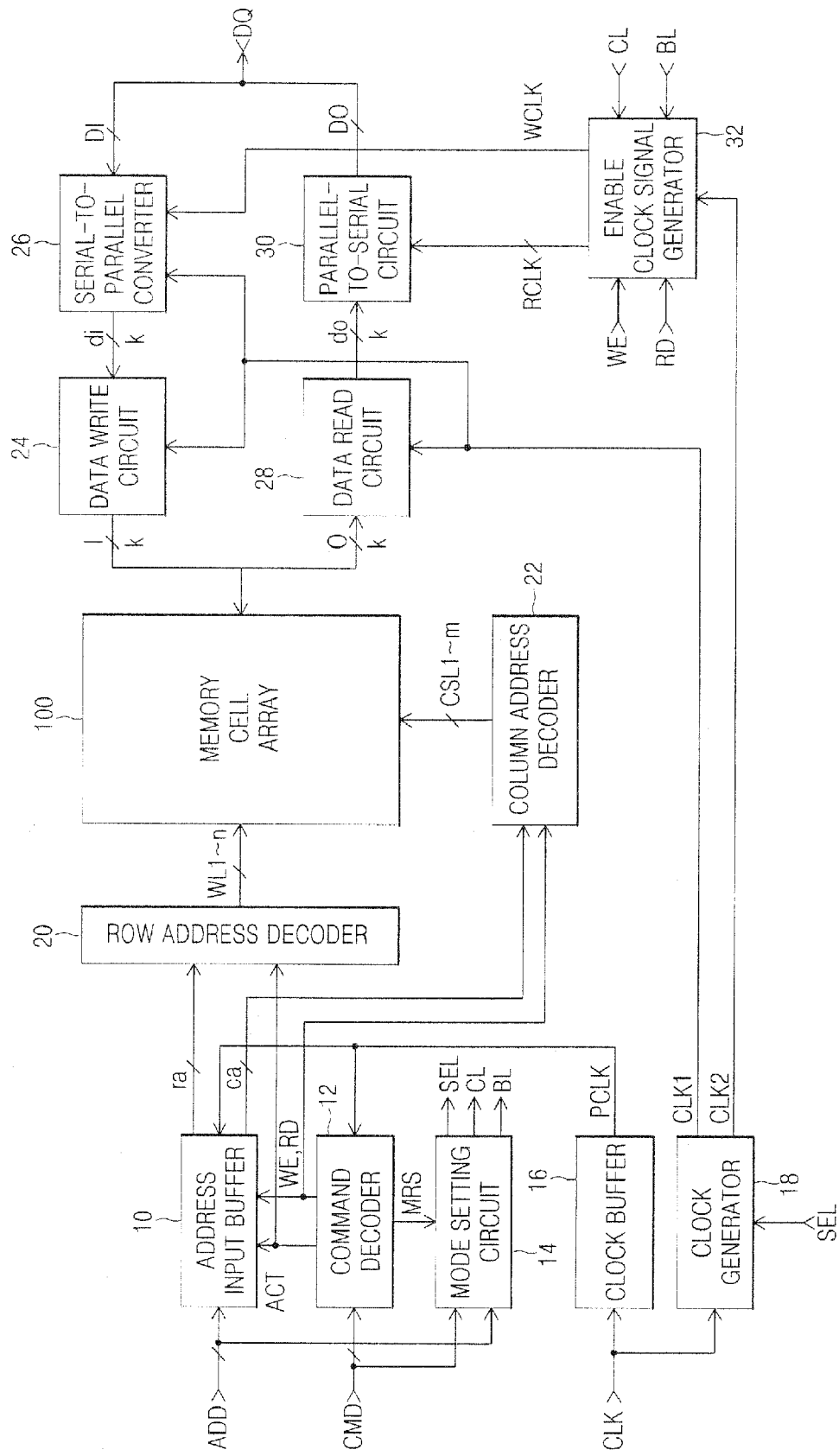
FIG. 1 is a block diagram illustrating a semiconductor memory device according to an embodiment.
Figure 8:
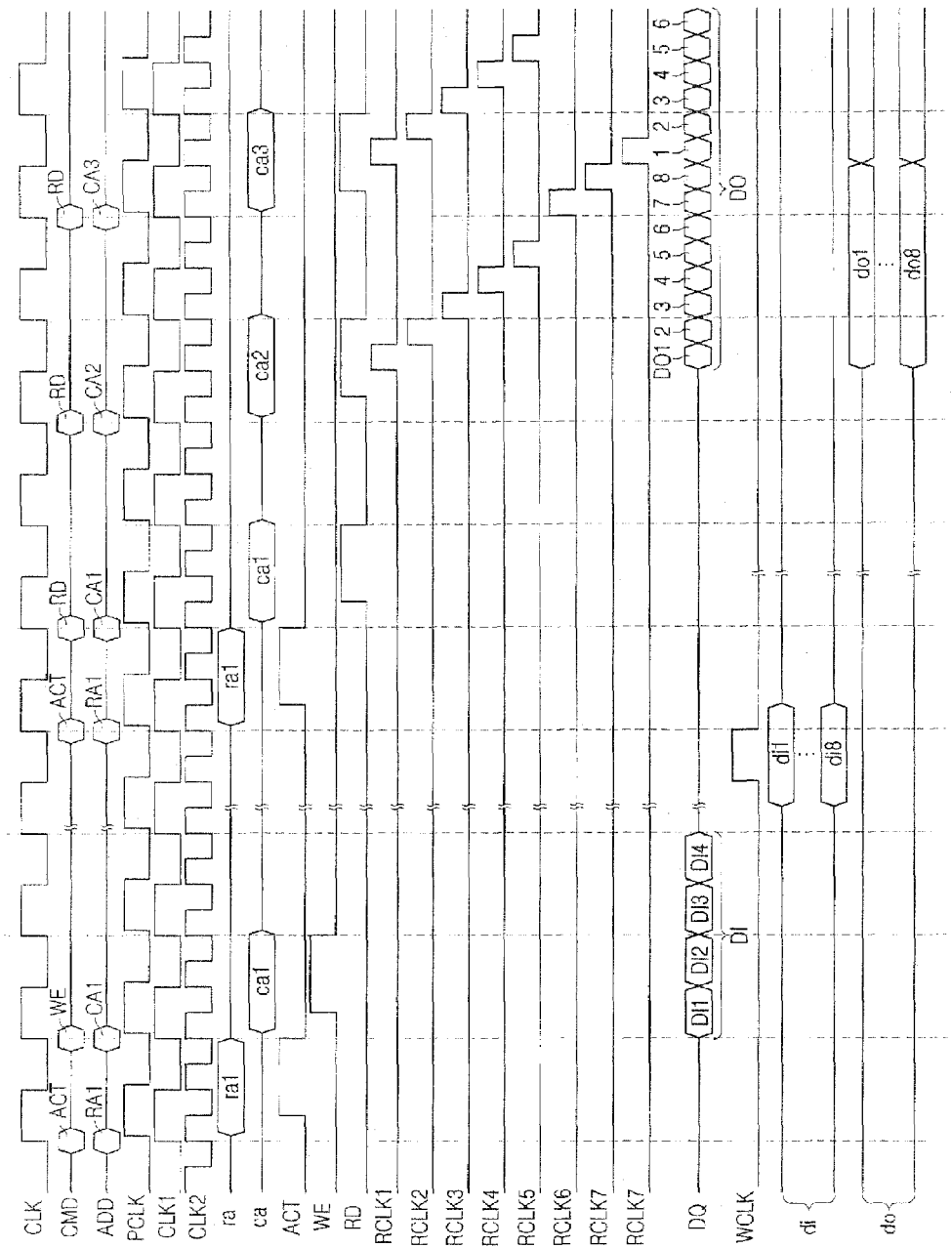
Figure 9:
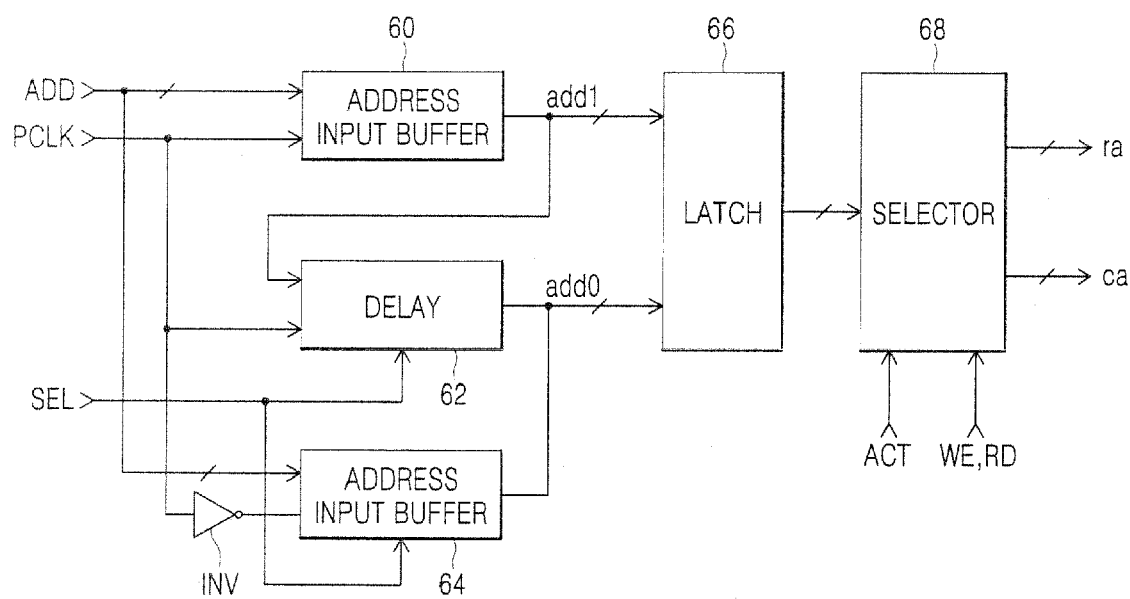
Figure 10:
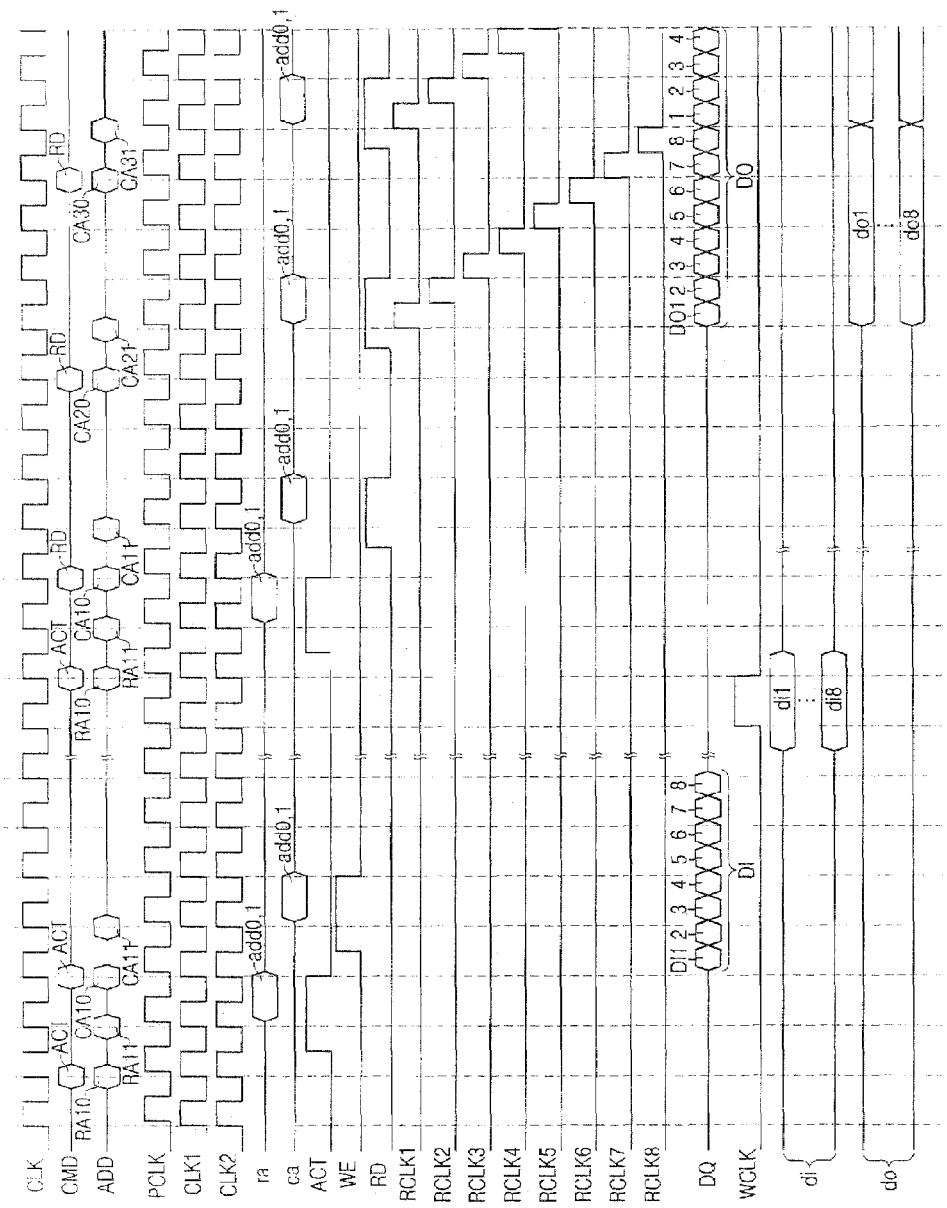
Figure 11:
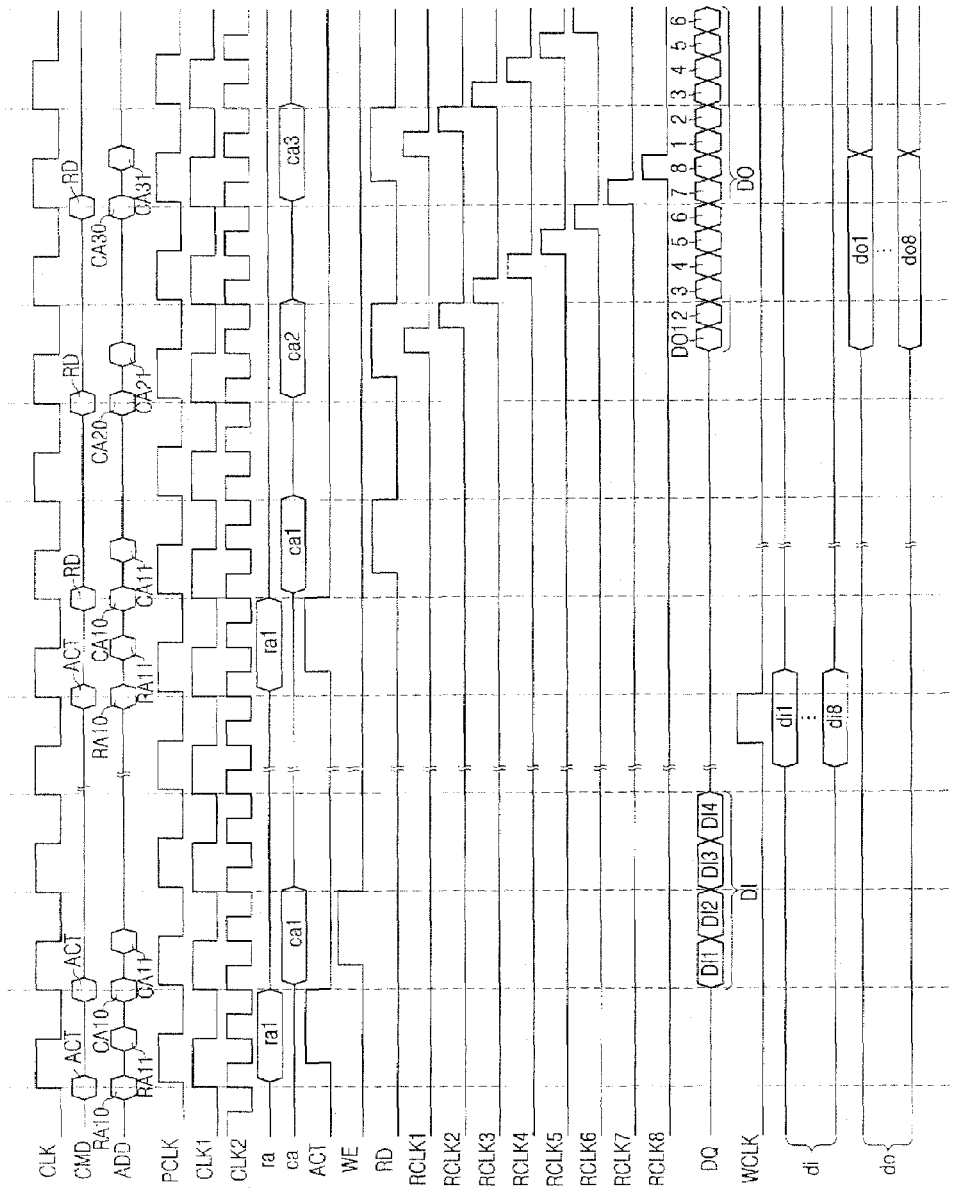

FIG, 7 is a timing diagram illustrating normal write and read operation of the semiconductor memory device of FIG. 1;

FIG. 8 is a timing diagram illustrating test write and read operation of the semiconductor memory device of FIG. 1;

FIG. 9 is a block diagram illustrating an address input buffer of the semiconductor memory device according to another embodiment of the present invention;

FIG. 10 is a timing diagram illustrating the normal operation of the semiconductor memory device having the address input buffer of FIG. 9; and FIG. 11 is a timing diagram illustrating the test operation of the semiconductor memory device having the address input buffer of FIG. 9.

DETAILED DESCRIPTION

Embodiments will now be described more fully hereinafter with reference to the accompanying drawings. Embodiments may take different forms and should not be construed as limited to the embodiments set forth herein. Rather, these embodiments are provided so that this disclosure will be thorough and complete, and will fully convey the scope to those skilled in the art.

FIG. 1 is a block diagram illustrating a semiconductor memory device. The semiconductor memory device of FIG. 1 includes a memory cell array 100, an address input buffer 10, a command decoder 12, a mode setting circuit 14, a clock buffer 16, a clock generator 18, a row address decoder 20, a column address decoder 22, a data write circuit 24, a serial-to-parallel converter 26, a data read circuit 28, a parallel-to-serial converter 30, and an enable clock signal generator 32.

Functions of the components of FIG. 1 are explained below.

The address input buffer 10 receives and buffers an address ADD to generate a row address ra in response to an active signal ACT and a buffered clock signal PCLK during an active operation, and receives and buffers an address ADD to generate a column address ca in response to a write or read signal WE or RD and a buffered clock signal PCLK during a write or a read operation. The command decoder 12 decodes a command signal CMD to generate a mode setting signal MRS, an active signal ACT, a write signal WE, and a read signal RD in response to the buffered clock signal PCLK. The mode setting circuit 14 receives a code signal applied through a terminal to which the address ADD is applied to set a selection signal SEL, a CAS latency signal CL, and a burst length signal BL in response to the mode setting signal MRS during a mode setting operation. The clock buffer 16 buffers a clock signal CLK to generate the buffered clock signal PCLK. The clock generator 18 generates clock signals CLK1 and CLK2 in response to the selection signal SEL. The clock generator 18 generates the clock signals CLK1 and CLK2 having the same phase and frequency as the clock signal CLK during the normal operation, and generates the clock signal CLK1 having the same phase and frequency as the clock signal CLK and the clock signal CLK2 having the same phase as but twice frequency of the clock signal CLK during the test operation. The row address decoder 20 decodes a buffered row address ra to activate one of n word selecting signals WL1 to WLn. The column address decoder 22 decodes a buffered column address ca to activate one of m column selecting signals CSL1 to CSLm. The serial-to-parallel converter 26 converts serial data into parallel data. Thus, serial data DI is converted by the serial-to-parallel converter 26 into parallel data dim having a width of k bits, where k corresponds to a burst length. The serial-to-parallel converter 26 operates in response to the clock signal CLK1 and a write enable clock signal WCLK during the normal operation. In the test operation, the serial-to-parallel converter 26 converts serial data DI into parallel data and adds additional bits to generate parallel data having a width of k bits. The number of bits of the serial data input during the normal operation is twice as many as the number of bits of the serial data input during the test operation. In the test operation, the bits of the serial data and a duplicate of the serial data form the parallel data. Thus, even though one half of the number of bits are input during the test operation as compared to the normal operation, the same number of bits of parallel data are generated during an equivalent time period.

The data write circuit 24 receives the k-bit parallel data di to generate k-bit parallel write data I in response to the clock signal CLK1. The data read circuit 28 receives k-bit parallel read data O output from the memory cell array 100 to generate k-bit parallel data do. The parallel-to-serial converter 30 converts the k-bit parallel data do into serial data DO in response to a read enable clock signal RCLK during the normal operation and the test operation. The enable clock signal generator 32 generates the write enable clock signal WCLK in response to the write signal WE and the clock signal CLK2 during the write operation, and generates the read enable clock signal RCLK in response to the read signal RD, the CAS latency signal CL, the burst length signal BL, and the clock signal CLK2 during the read operation.

As a result, the semiconductor memory device of FIG. 1 writes and reads data at a double data rate in response to the clocks CLK1 and CLK2 which have the same phase and frequency as the clock signal CLK during the normal operation. However, during the test write operation, the semiconductor memory device of FIG. 1 receives data at a double data rate in response to the clock signal CLK1 having the same phase as the clock signal CLK and duplicates the data to write data at the same bit rate as the normal operation. During the test read operation, the clock signal CLK2 is generated having the same phase as the clock signal CLK, but two or four times frequency of the clock signal CLK. The semiconductor memory device of FIG. 1 may also read the data at a quad or octal data rate in response to the clock signal CLK2. Here, the double data rate means that 2 data bits are serially transmitted within one clock cycle of the clock signal CLK, the quad data rate means that 4 data bits are serially transmitted within one clock cycle of the clock signal CLK, and the octal data rate means that 8 data bits are serially transmitted within one clock cycle of the clock signal CLK.

Accordingly, the semiconductor memory device receives a smaller number of data bits than during the normal write operation, yet writes the same number of bits in the test write operation as during the normal write operation. Furthermore, the semiconductor memory device may transmit read data at the same bitrate during both the normal and test read operations, even though a clock signal with a different frequency is used.

Figure 2:
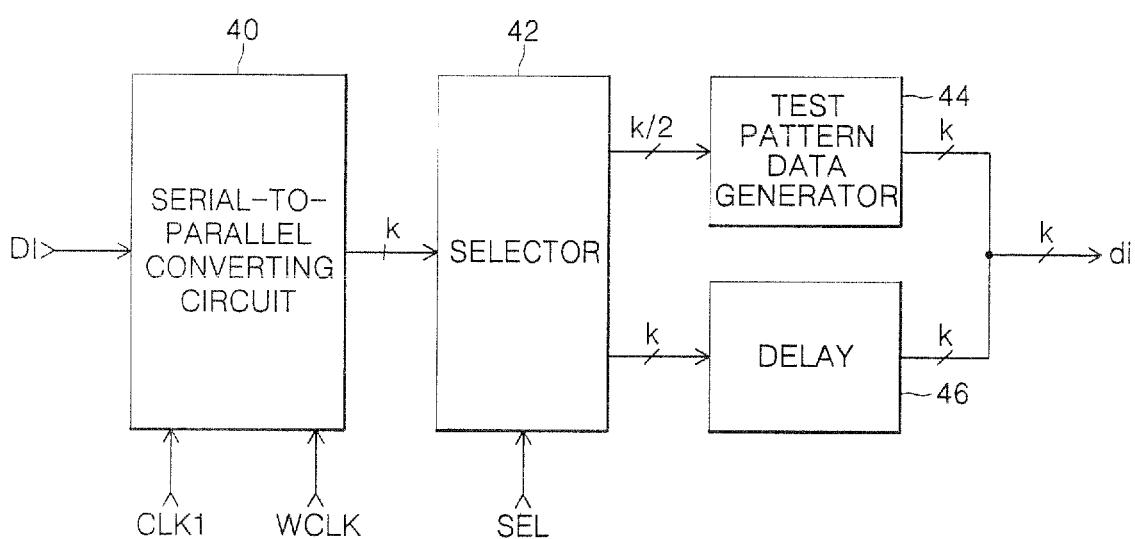
FIG. 2 is a block diagram illustrating a serial-to-parallel converter which is shown in FIG. 1.

FIG. 2 is a block diagram illustrating the serial-to-parallel converter shown in FIG. 1. The serial-to-parallel converter of FIG. 2 includes a serial-to-parallel converting circuit 40, a selector 42, a test pattern data generator 44, and a delay 46.

Functions of the components of FIG. 2 are explained below.

The serial-to-parallel converting circuit 40 converts the serial data DI into the k-bit parallel data in response to the clock signal CLK1 and the write enable clock signal WCLK. In response to the selection signal SEL, the selector 42 outputs the k-bit parallel data to the delay 46 during the normal operation and outputs the k/2-bit parallel data to the test pattern data generator 44 during the test operation. The test pattern data generator 44 receives the k/2-bit parallel data and duplicates the k/2-bit parallel data to generate the k-bit parallel data di. The delay 46 delays the k-bit parallel data from the selector 42 to generate the k-bit parallel data di. A delay time of the delay 46 is the same as a time spent when the k/2-bit parallel data passes though the test pattern data generator 44.

The serial-to-parallel converter of FIG. 2 receives the k/2-bit serial data, converts it into the k/2-bit parallel data, and then duplicates it to generate the k-bit parallel data. If k/4- or k/8-bit serial data is input, the test pattern data generator may be configured to duplicate the k/4- or k/8-bit serial data four or eight times to generate the k-bit parallel data.

Figure 3:
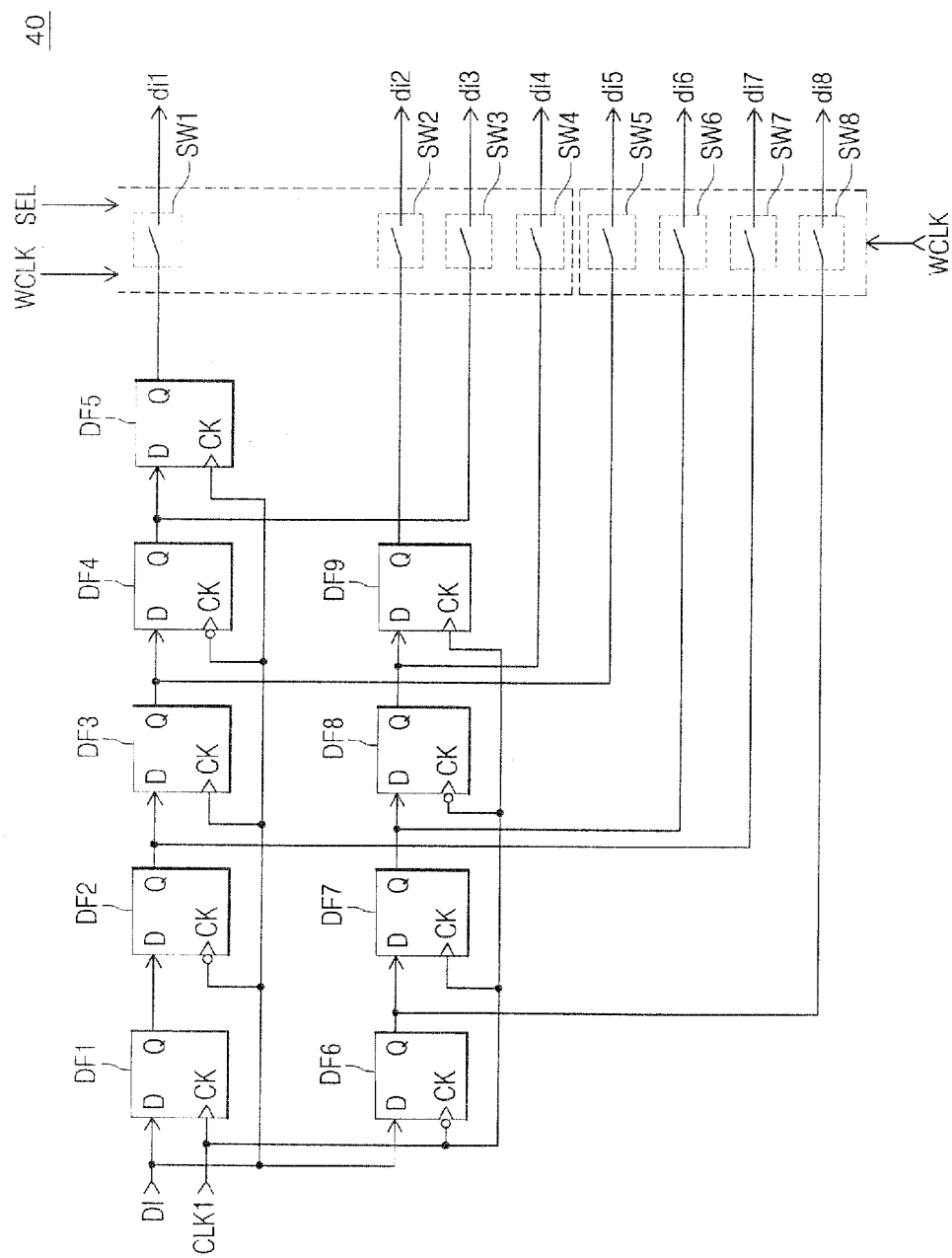
FIG. 3 is a circuit diagram illustrating a serial-to-parallel circuit which is shown in FIG. 2.

FIG. 3 is a circuit diagram illustrating the serial-to-parallel circuit shown in FIG. 2. The serial-to-parallel circuit of FIG. 3 includes D flip-flops DF1 to DF9 and switches SW1 to SW8.

Functions of the components of FIG. 3 are explained below.

The D flip-flops DF1, DF3, DF5, DF7, and DF9 respectively receive and output the data DI and output signals of the D flip-flops DF2, DF4, DF6, and DF8 in response to a rising transition of the clock signal CLK1. The D flip-flops DF2, DF4, DF6, and DF8 respectively receive and output signals of the D flip-flops DF1 and DF3, the data D1, and an output signal of the D flip-flop DF7 in response to a falling transition of the clock signal CLK1. The switches SW1 to SW4 are turned on in response to the selection signal SEL and the write enable clock signal WCLK to output the output signals of the D flip-flops DF5, DF9, DF4, and DF8 as 4-bit parallel data di1 to di4 during the normal write operation. The switches SW1 to SW4 are turned off in response to the selection signal SEL during the test write operation. The switches SW5 to SW8 output the output signals of the D flip-flops DF3, DF7, DF2, and DF6 as the 4-bit parallel data di5 to di8 in response to the write enable clock signal WCLK.

If it is assumed that the data DI1 to DI8 are serially input, with DI8 first in time, to the serial-to-parallel converting circuit of FIG. 3 during the normal operation, the data DI8 is stored in the D flip-flop DF5 and then output, the data DI7 is stored in the D flip-flop DF9 and then output, the data DI6 is stored in the D flip-flop DF4 and then output, the data DI5 is stored in the D flip-flop DF8 and then output, the data DI4 is stored in the D flip-flop DF3 and then output, the data DI3 is stored in the D flip-flop DF7 and then output, the data DI2 is stored in the D flip-flop DF2 and then output, and the data DI1 is stored in the D flip-flop DF6 and then output. The switches SW1 to SW8 are turned on in response to the selection signal SEL and the write enable signal WCLK to generate 8-bit parallel data di1 to di8 during the normal write operation and generate the 4-bit parallel data di5 to di8 during the test write operation.

The serial-to-parallel converting circuit of FIG. 3 receives the 8-bit serial data DI to generate the 8-bit parallel data di1 to di8 during the normal write operation and receives the 4-bit serial data Di to generate the 4-bit parallel data di5 to di8 during the test write operation.

Figure 4:
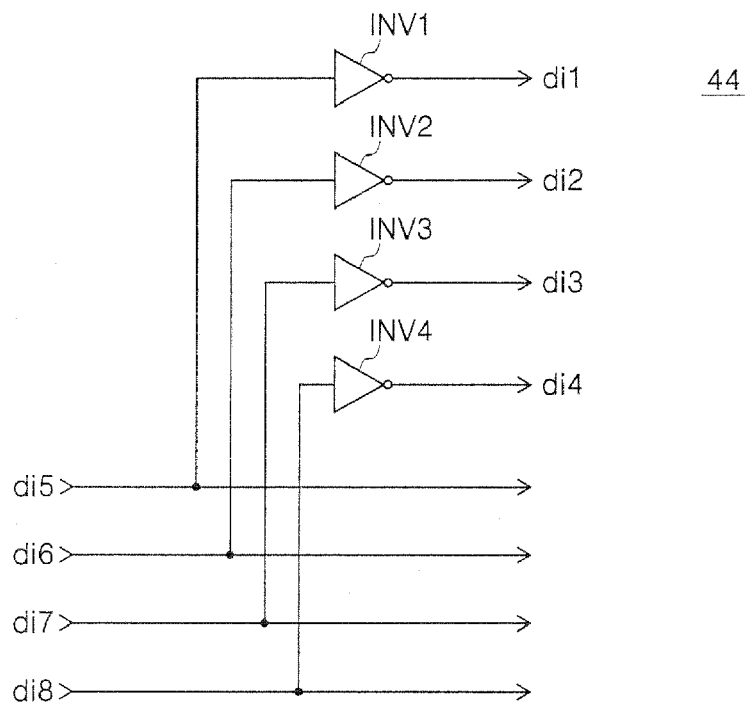
FIG. 4 is a circuit diagram illustrating a pattern data generator 44 which is shown in FIG. 2.

FIG. 4 is a circuit diagram illustrating the pattern data generator 44 which is shown in FIG. 2. The pattern data generator of FIG. 4 includes inverters INV1 to INV4. The inverters INV1 to INV4 invert the 4-bit parallel data di5 to di8 to generate the 4-bit parallel data di1 to di4. That is, the test pattern data generator 44 inverts the 4-bit parallel data di5 to di8 to generate the 4-bit parallel data di1 to di4, thereby generating total 8-bit parallel data di1 to di8.

Even though not shown, the test pattern data generator 44 need not include the inverters INV1 to INV4. Thus, it may generate the 4-bit parallel data di5 to di8 directly from the 4-bit parallel data di1 to di4 without inversion.

Figure 5:
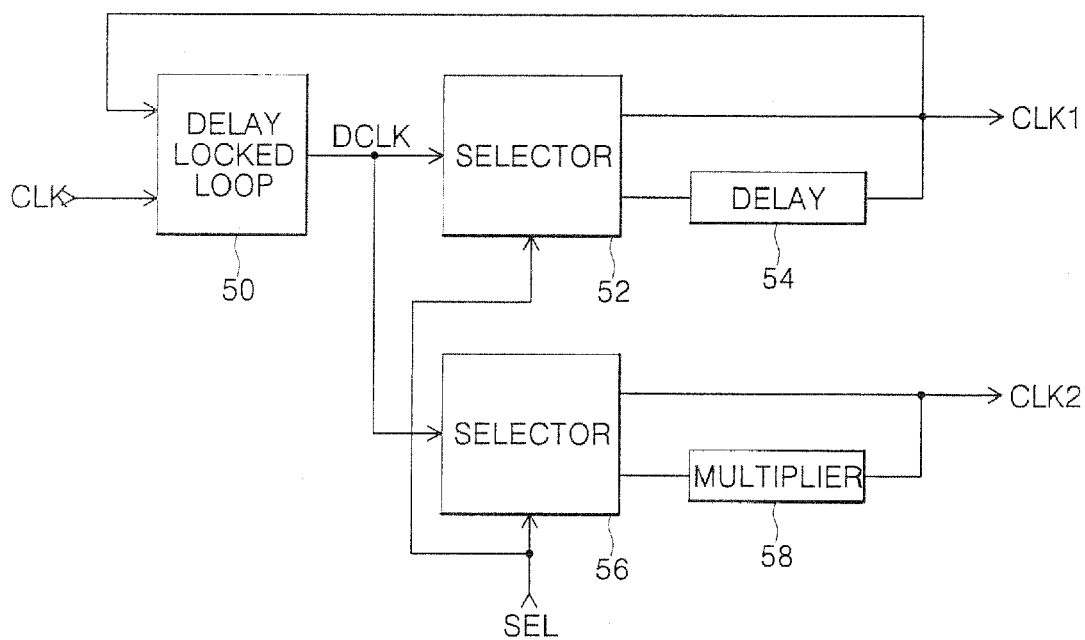
FIG. 5 is a block diagram illustrating a clock generator which is shown in FIG. 1.

FIG. 5 is a block diagram illustrating the clock generator which is shown in FIG. 1. The clock generator of FIG. 5 includes a delay locked loop 50, selectors 52 and 56, a delay 54, and a multiplier 58.

Functions of the components of FIG. 5 are explained below.

The delay locked loop 50 compares a phase difference between the clock signal CLK and the clock signal CLK1 to generate a delay locked signal DCLK synchronized with the clock signal CLK. The selector 52 outputs the delay locked signal DCLK as the clock signal CLK1 during the normal operation and outputs the delay locked signal DCLK to the delay 54 during the test operation. The selection is made in response to the selection signal SEL. The delay 54 delays the delay locked signal DCLK output from the selector 52 by a predetermined time to generate the clock signal CLK1. The selector 56 outputs the delay locked signal DCLK as the clock signal CLK2 during the normal operation and outputs the delay locked signal DCLK to the multiplier 58 during the test operation. The selection is made in response to the selection signal SEL. The multiplier 58 multiplies a frequency of the delay locked signal DCLK output from the selector 56 to generate the clock signal CLK2. For example, the frequency of the clock signal CLK2 may be double the frequency of the clock signal CLK1. The frequency of the clock signal CLK1 may be multiplied by any rational number to generate the frequency of the clock signal CLK2. As such, for a given rational number multiplier, there will be a first integer number of cycles of the clock signal CLK1 and a second integer number of clock cycles of the clock signal CLK2 within a finite time period. Preferably, a delay time of the delay 52 is the same as a time spent when the delay locked signal DCLK passes through the multiplier 54.

Figure 6:
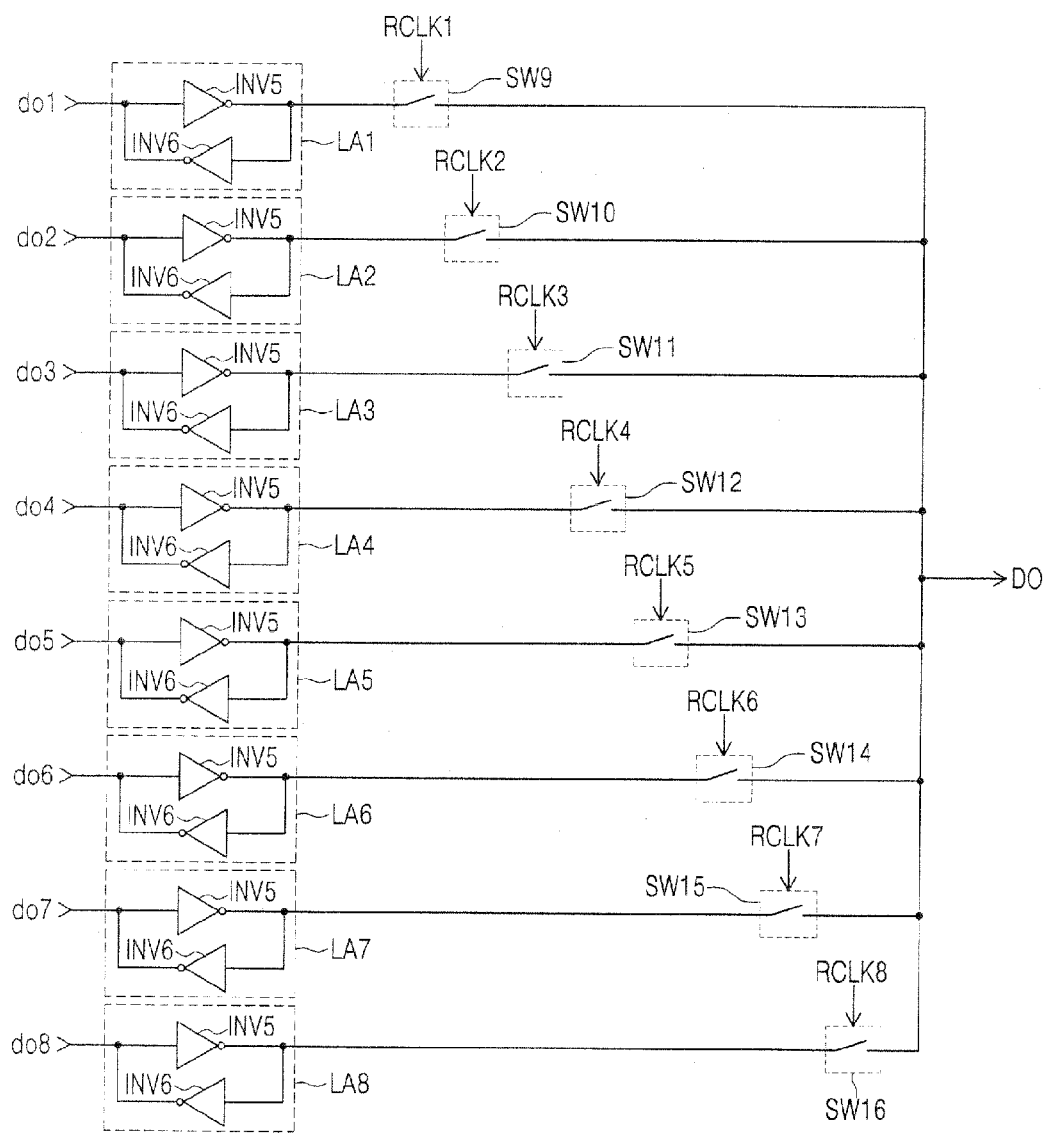
FIG. 6 is a circuit diagram illustrating a parallel-to-serial converter which is shown in FIG. 1.

FIG. 6 is a circuit diagram illustrating the parallel-to-serial converter that is shown in FIG. 1. The parallel-to-serial converter of FIG. 6 includes switches SW9 to SW16 and latches LA1 to LA8, each of which includes inverters INV5 and INV6.

Functions of the components of FIG. 6 are explained below.

The latches LA1 to LA8 latch 8-bit parallel data do1 to do8. The switches SW9 to SW16 sequentially output data latched by the latches LA1 to LA8 as the data DO in response to the sequentially generated read enable clock signals RCLK1 to RCLK8.

Thus, the parallel-to-serial converter of FIG. 6 latches the 8-bit parallel data do1 to do8 using the latches LA1 to LA8, and converts the 8-bit parallel data do1 to do8 to generate the serial data DO in response to the read enable clock signals RCLK1 to RCLK8.

Figure 7:
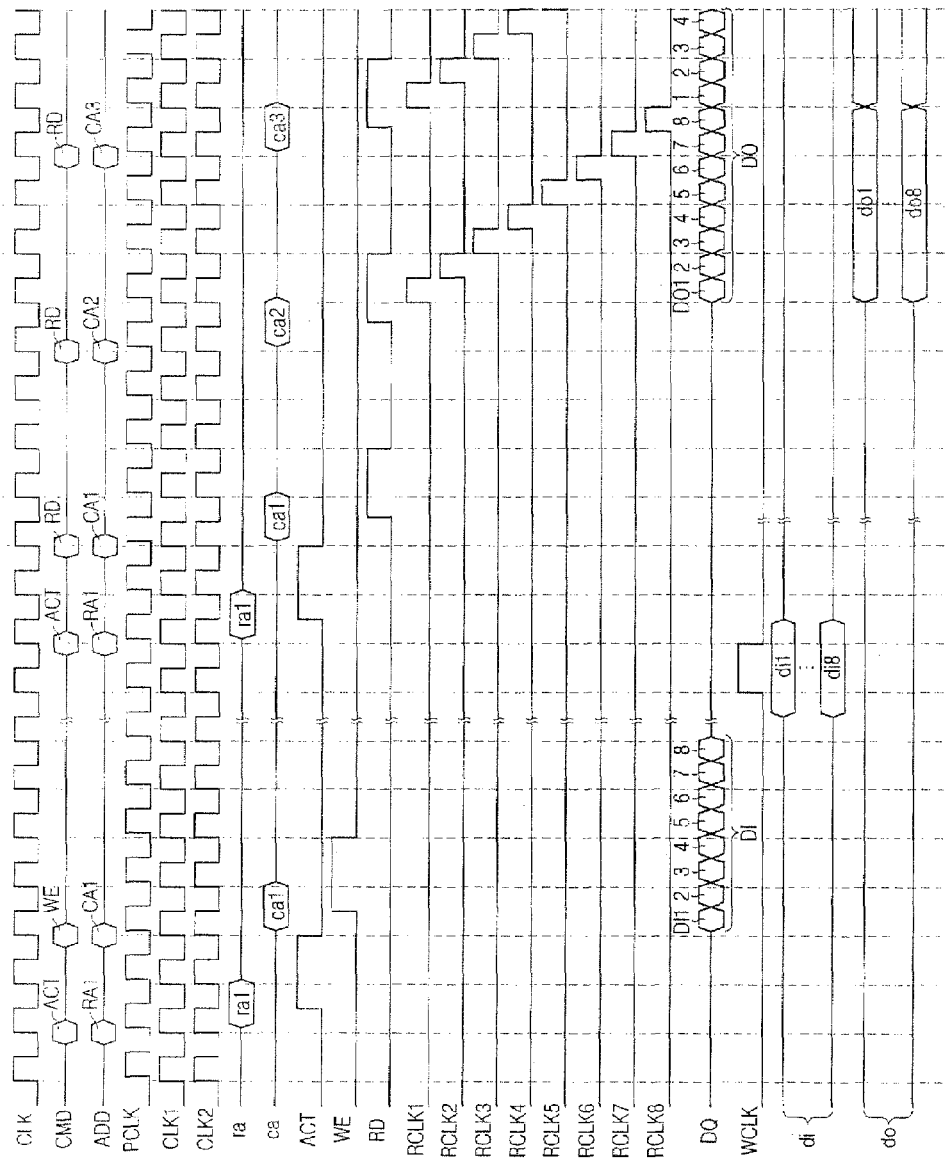

FIG. 7 is a timing diagram illustrating normal write and read operations of the semiconductor memory device of FIG. 1. In FIG. 7, during the mode setting operation, the mode setting circuit 14 sets the selection signal SEL to a low level, and sets a code signal for setting the burst length to 8. A CAS latency corresponding to the CAS latency signal CL is not considered.

The clock buffer 16 buffers the clock signal CLK to generate the buffered clock signal PCLK, and the clock generator 18 generates the clock signals CLK1 and CLK2 which have the same phase and frequency as the clock signal CLK in response to the selection signal SEL having a low level.

For a write operation, the row address RA1 is applied with the active command ACT, the command decoder 12 internally generates the active command ACT and the address input buffer 10 buffers the row address RA1 to generate the buffered row address ra1 in response the buffered clock signal PCLK. The row address decoder 20 decodes the buffered row address ra1 to generate the word line selecting signals WL1 to WLn, so that one of the word line selecting signals WL1 to WLn is activated. Then, the column address CA1 is applied together with the write command WE, the command decoder 12 generates the write command WE, and the address input buffer 10 buffers the column address CA1 to generate the buffered column address ca1 in response to the buffered clock signal PCLK. The column address decoder 22 decodes the buffered column address ca1 to generate the column selecting signals CSL1 to CSLm, so that one of the column selecting signals CSL1 to CSLm is activated. The enable clock signal generator 32 generates the write enable clock signal WCLK having an effective data pulse width in response to the clock signal CLK2 and the write command WE. The serial-to-parallel converter 26 converts the 8-bit serial data DI1 to DI8 to generate the 8-bit parallel data di1 to di8 in response to the clock signal CLK2, the selection signal SEL having a low level, and the write clock signal WCLK. The data write circuit 24 receives the 8-bit parallel data di1 to di8 to generate data I in response to the clock signal CLK1, and the data I is written to selected memory cells of the memory cell array 100. Thus, data is written to the memory cell array 100.

For a read operation, the row address RA1 is applied together with the active command ACT, the same operation as when the active command is applied during a write operation is performed. Thus, one of the word line selecting signals WL1 to WLn is activated. Then, the column address CA1 is applied together with the read command RD, the command decoder 12 generates the read command RD, and the address input buffer 10 buffers the column address CA1 to generate the buffered column address ca1 in response to the buffered clock signal PCLK. The column address decoder 22 decodes the buffered column address ca1 to generate the column selecting signals CSL1 to CSLm, so that one of the column selecting signals CSL1 to CSLm is activated. The enable clock signal generator 32 generates the read enable clock signals RCLK1 to RCLK8 having an effective data pulse width in response to the clock signal CLK2, the read command RD, the burst length signal BL, and the CAS latency signal CL. The data read circuit 28 receives the 8-bit parallel data O output from the memory cell array 100 to generate data do in response to the clock signal CLK. The parallel-to-serial converter 30 converts the 8-bit parallel data do1 to do8 to generate the 8-bit serial data DO in response to the read clock signals RCLK1 to RCLK8. Thus, in the method described above, the read operation is performed.

FIG. 8 is a timing diagram illustrating test write and read operations of the semiconductor memory device of FIG. 1. In FIG. 8, during the mode setting operation, the mode setting circuit 14 sets the selection signal SEL to a high level, a code signal for setting the burst length to 8 is applied so that the selection signal SEL is set to a high level, and the burst length signal BL is set to 8. Although a CAS latency corresponding to the CAS latency signal CL is not shown, the CAS latency may be included as desired.

The clock buffer 16 buffers the clock signal CLK to generate the buffered clock signal PCLK. The clock generator 18 generates the clock signals CLK1 having the same phase and frequency as the clock signal CLK. The clock generator 18 also generates the clock signal CLK2 having the same phase as and twice frequency of the clock signal CLK in response to the selection signal SEL having a high level.

In a test write operation, the row address RA1 is applied together with the active command ACT, a similar operation as described in the normal write operation is performed. Thus, one of the word line selecting signals WL1 to WLn is activated. Then, the column address CA1 is applied together with the write command WE, a similar operation as described in the normal write operation is performed. Thus, one of the column selecting signals CSL1 to CSLm is activated. The enable clock signal generator 32 generates the write enable clock signal WCLK having an effective data pulse width in response to the clock signal CLK2 and the write command WE. The serial-to-parallel converter 26 converts the 4-bit serial data DI to generate the 8-bit parallel data di1 to di8 in response to the clock signal CLK2, the selection signal SEL having a low level, and the write clock signal WCLK. The data write circuit 24 receives the 8-bit parallel data di1 to di8 to generate data I in response to the clock signal CLK1, and the data I is written onto selected memory cells of the memory cell array 100. In the method described above, data is written onto the memory cell array 100. Since a frequency of the clock signal CLK for the test operation is one half (½) of a frequency of the clock signal applied for the normal operation, if the 8-bit data is input in response to the clock signal CLK, the time to input the 8-bit data is doubled as compared with the normal operation. However, if the 4-bit serial data is input during the test operation, the time to input the 4-bit data is the same time to input the 8-bit serial data in the normal operation. Thus. 8-bit parallel data is generated in response to the clock signal CLK2 in the test operation during the same time period as during the normal operation.

In a test read operation, the row address RA1 is applied together with the active command ACT so that a similar operation as when the active command ACT is applied in the test write operation is performed. Thus, one of the word line selecting signals WL1 to WLn is activated. Then, the column address CA1 is applied together with the read command RD so that a similar operation as when the read command RD is applied in the test write operation is performed. Thus, one of the column selecting signals CSL1 to CSLm is activated. The enable clock signal generator 32 generates the read enable clock signals RCLK1 to RCLK8 having an effective data pulse width in response to the clock signal CLK2, the read command RD, the burst length signal BL, and the CAS latency signal CL. The data read circuit 28 receives the 8-bit parallel data O output from the memory cell array 100 to generate data do1 to do8 in response to the clock signal CLK.

The parallel-to-serial converter 30 converts the 8-bit parallel data do1 to do8 to generate the 8-bit serial data DO in response to the read clock signals RCLK1 to RCLK8. During the test operation, the 8-bit parallel data is converted to generate the serial output data DO in response to the clock signal CLK2 having twice frequency of the clock signal CLK.

Thus, even though the clock signal CLK applied during the test operation is lower in frequency than the clock signal CLK during the normal operation, the semiconductor memory device converts data which is applied at the double data rate relative to the clock signal CLK into data of quad data rate then writes data, and reads the data at the quad data rate. Thus, the test device that may only generate a clock signal having a lower frequency can still be used to test the semiconductor memory device which operates with a clock signal having a higher frequency without increasing the test time.

The semiconductor memory device described above includes the test data generator to generate additional bits from the serial data for the parallel data, and write the parallel data to the memory cell array. However, an embodiment of the semiconductor memory device may not include the test data generator and thus, the data is written onto the memory cell array without additional bits. In this example, a time to write data onto the memory cells of the memory cell array during the test operation is increased.

An embodiment of a semiconductor memory device described above may be configured such that the address input buffer inputs the address ADD in response to the buffered clock signal PCLK once. However, the address ADD may be divided to be input in multiple portions. Thus, in an embodiment of the semiconductor memory device using a double dumped address method where the address is input in two portions, a configuration of the address input buffer may be different.

FIG. 9 is a block diagram illustrating the address input buffer of the semiconductor memory device according to another embodiment. The address input buffer of FIG. 9 includes address input buffers 60 and 64, an inverter INV, a delay 62, a latch 66, and a selector 68. The address input buffer of FIG. 9 may be used in a semiconductor memory device that receives the address in two or more portions.

Functions of the components of FIG. 9 are explained below. The address input buffer 60 buffers the address ADD to generate an address add1 in response to a rising edge of the buffered clock signal PCLK. The delay 62 is enabled in response to the selection signal SEL, and delays the address add1 to generate an address add0 in response to a rising edge of the buffered clock signal PCLK. That is, the delay 62 delays the buffered address add1 during one clock cycle to generate the address add0. The address input buffer 64 is enabled in response to the selection signal SEL and buffers the address ADD to generate the address add0 in response to a falling edge of the buffered clock signal PCLK. The latch 66 latches the addresses add1 and add0 respectively output from the address input buffer 60 and the delay 62 during the normal operation and latches the addresses add1 and add0 respectively output from the address input buffers 60 and 64 during the test operation. The selector 68 receives the latched address latched by the latch 66 to generate a row address ra in response to the active signal ACT and to generate a column address ca in response to the write signal WE or a read signal RD.

For example, if the address ADD is a 10-bit address ADD1 to ADD10 having a lower-bit address ADD1 to ADD5 and an upper-bit address ADD6 to ADD10, where the lower-bit address ADD1 to ADD5 and the upper-bit address ADD6 to ADD10 are sequentially input, the address input buffer 60 and the delay 62 generate the upper-bit address ADD10 to ADD6 and the lower-bit address ADD5 to ADD1 as addresses add1 and add0, respectively, in response to a rising edge of the buffered clock signal PCLK during the normal operation. The address input buffers 60 and 64 generate the upper-bit address ADD10 to ADD6 and the lower-bit address ADD5 to ADD1 as addresses add1 and add0, respectively, in response to rising and falling edges of the buffered clock signal PCLK during the test operation.

In the address input buffer of FIG. 9, the address ADD is divided into upper bits and lower bits and thus is input in two portions. The address ADD is input in response to a rising edge of the clock signal PCLK during the normal operation, and is input in response to rising and falling edges of the clock signal PCLK during the test operation. Thus, even though the frequency of the clock signal PCLK during the test operation may be one half (½) of the frequency of the clock signal PCLK for the normal operation, the address ADD can be input to the semiconductor memory device during the same amount of time.

FIG. 10 is a timing diagram illustrating the normal operation of the semiconductor memory device having the address input buffer of FIG. 9. The timing diagram of FIG. 10 is similar to that of FIG. 7 except for timing of the address ADD, the row address ra and the column address ca. Thus, only timing of the addresses ADD, ra and ca is explained below. The active command ACT and the lower-bit address RA10 are input in response to a rising edge of the clock signal CLK. The address input buffer 60 of FIG. 9 buffers the lower-bit address RA10 to generate a buffered address add1 in response to the buffered clock signal PCLK. Then, the upper-bit address RA11 is input in response to a rising edge of the clock signal CLK, and the delay 62 delays the buffered address add1 output from the address input buffer 60 during one clock cycle to generate an address add0. The address input buffer 60 buffers the upper-bit address RA11 to generate a buffered address add1 in response to the buffered clock signal PCLK. The latch 66 latches the buffered addresses add1 and add0, and the selector 68 generates the signal latched by the latch 66 as a row address ra1 in response to the active signal ACT. A column address ca1 may be generated in the same way as the row address ra1 is generated.

FIG. 11 is a timing diagram illustrating the test operation of the semiconductor memory device having the address input buffer of FIG. 9. The timing diagram of FIG. 11 is similar to that of FIG. 8 except for timing of the address ADD, the row address ra and the column address ca. Thus, only timing of the addresses ADD, ra and ca is explained below. The active command ACT and the lower-bit address RA10 are input in response to a rising edge of the clock signal CLK. The address input buffer 60 of FIG. 9 buffers the lower-bit address RA10 to generate a buffered address add1 in response to the buffered clock signal PCLK. Then, the upper-bit address RA11 is input in response to a falling edge of the clock signal CLK. The address input buffer 64 buffers the upper-bit address RA11 to generate a buffered address add0. The latch 66 latches the buffered addresses add1 and add0, and the selector 68 generates the signal latched by the latch 66 as a row address ra1 in response to the active signal ACT. A column address ca1 may be generated in the same way as the row address ra1 is generated.

It can be understood from the timing diagrams of FIGS. 10 and 11 that even though the address ADD is divided into upper bits and lower bits to be input, the upper bits and the lower bits are generated as one row address ra or one column address ca in the semiconductor memory device.

In the embodiment described above, an embodiment where the address ADD is divided into two portions to be input sequentially has been described. However, the command CMD may similarly be divided into multiple portions to be applied by adding to the command decoder a similar configuration to the address input buffer of FIG. 9.

In the embodiment described above, the normal operation and the test operation have been separately described. However, in case where the system which uses the semiconductor memory device with a clock signal having a low frequency, the semiconductor memory device may operate in the test operation while set to operate in the normal operation. In other words, even though the semiconductor memory device may be operated with a high clock frequency, if a lower clock frequency is used in operation, the lower clock frequency may be used to test the semiconductor memory device while set in the normal operating mode.

In an embodiment described above, the semiconductor memory device may output data at a double data rate during the normal read operation and output data at a quad data rate during the test read operation. However, other embodiments include semiconductor memory devices that outputs data at a double data rate during the normal read operation and outputs data at an octal data rate during the test read operation. Another embodiment may include a semiconductor memory device that outputs data at a quad data rate during the normal read operation and outputs data at an octal data rate during the test read operation.

The difference in the data rates during the normal and test operations is a result of the different clock frequencies used in the operations. For example, in the embodiment described above outputting data at a double data rate in the normal read operation and outputting data at an octal data rate in the test read operation, the input clock frequencies in those operations may be different by a factor of four.

In order for the semiconductor memory device to output data at a double data rate and output data at an octal data rate during the test read operation, it is necessary to use a circuit for multiplying the frequency of the clock signal output from the selector 56 by four times instead by two as described above.

As described above, embodiment of the semiconductor memory device and the data write and read method can write and read data at the same speed as the normal operation even though the test is performed by the test device which generates the clock signal of the low frequency, thereby reducing the test time and achieving the accurate test.

Also, the discrete test device for the semiconductor memory device which operates at the high frequency is not required, thereby reducing a cost for purchasing the test device.

Although embodiments have been described above, it will be apparent to one of ordinary skill in the art that various changes and modifications may be made without departing from the spirit and scope of the following claims.

What is claimed is:

1. A semiconductor memory device, comprising:
   a memory cell array for writing and reading data;
   a clock signal generating means for receiving an external clock signal applied from an external portion to generate first and second clock signals having the same phase and frequency as the external clock signal during a normal operation including a normal read operation and a normal write operation and to generate the first clock signal having the same phase and frequency as the external clock signal and the second clock signal having the same phase as and a higher frequency than the external clock signal during a test operation including a test read operation and a test write operation;
   a data write means for receiving a first predetermined-bit serial input data applied at a first data rate and converting the first predetermined-bit serial input data into a first predetermined-bit parallel input data in response to the first clock signal during the normal write operation and for receiving and converting a second predetermined-bit serial input data having a second predetermined-bit number that is smaller than a first predetermined-bit number of the first predetermined-bit serial input data into a second predetermined-bit parallel input data, and extending the second predetermined-bit parallel input data to the first predetermined-bit number to generate the first predetermined-bit parallel input data in response to the second clock signal during the test write operation, and for outputting the first predetermined-bit parallel input data to the memory cell array in response to the first clock signal during the normal write operation and the test write operation; and
   a data read means for generating a first predetermined-bit parallel output data outputted from the memory cell array in response to the first clock signal during the normal read operation and the test read operations, converting the first predetermined-bit parallel output data into serial output data and outputting the serial output data at the first data rate in response to the second clock signal during the normal read operation, and converting the predetermined-bit parallel output data into serial data and outputting the serial output data at a second data rate in response to the second clock signal during the test read operation.

2. The semiconductor memory device of claim 1, wherein the frequency of the external clock signal applied for the test operation is lower than the frequency of the external clock signal applied for the normal operation.

3. The semiconductor memory device of claim 2, wherein the clock signal generating means includes
   a delay locked loop for detecting a phase difference between the external clock signal and the first clock signal to generate a delay clock signal;
   a first clock signal generator for generating the delay clock signal as the first clock signal during the normal operation and for delaying the delay clock signal during a predetermined time and then generating the delayed delay clock signal as the first clock signal during the test operation; and
   a second clock signal generator for generating the delay clock signal as the second clock signal during the normal operation and for multiplying a frequency of the delay clock signal by a predetermined number to generate the second clock signal,
   wherein the predetermined time is identical to a time spent for the second clock signal generator to multiply the frequency of the delay clock signal by the predetermined number to generate the second clock signal.

4. The semiconductor memory device of claim 3, wherein the data read means includes
   a data read circuit for receiving and outputting the first predetermined-bit parallel output data outputted from the memory cell array in response to the first clock signal during the normal read operation and the test read operation; and
   a parallel-to-serial converter for converting the first predetermined-bit parallel output data outputted from the data read circuit into the serial output data and outputting the serial output data at the first data rate in response to the second clock signal during the normal read operation and for converting the first predetermined-bit parallel output data outputted from the data read circuit into the serial output data and outputting the serial output data at a third data rate in response to the second clock signal during the test read operation.

5. The semiconductor memory device of claim 4, further comprising: the data write means includes
a serial-to-parallel converter for receiving and converting the first predetermined-bit serial input data applied at the first data rate into the first predetermined-bit parallel input data in response to the first clock signal during the normal write operation and for receiving and converting the second predetermined-bit serial input data having the second predetermined-bit number which is smaller than the first predetermined-bit number applied at the first data rate into the second predetermined-bit parallel input data and extending the second predetermined-bit parallel input data to the first predetermined-bit number to generate the first predetermined-bit parallel input data, in response to the second clock signal during the test write operation; and
a data write circuit for receiving and writing the first predetermined-bit parallel input data outputted from the serial-to-parallel converter onto the memory cell array in response to the first clock signal during the normal write operation and the test write operation.

6. The semiconductor device of claim 2, wherein the first data rate is a data rate which transmits data of a predetermined times of the second data rate within one cycle of the external clock signal.

7. The semiconductor device of claim 6, wherein the first data rate is a double data rate, and the second data rate is a quad data rate.

8. The semiconductor memory device of claim 7, further comprising: a mode setting means for receiving a code signal applied from an external portion to generate a selection signal for selecting the normal operation or the test operation and a burst length signal for setting the bit number of the predetermined-bit serial input and output data inputted from and outputted to an external portion, during a mode setting operation.

9. The device of claim 8, further comprising
an enable clock signal generator for generating a write enable clock signal in response to the second clock signal during the normal write operation and the test write operation and for generating a read enable clock signal for outputting the predetermined-bit serial data in response to the second clock signal and the burst length signal during the normal read operation and the test read operation.

10. A semiconductor memory device, comprising:
an address input means for receiving and buffering an address which is sequentially applied at least twice in response to a rising edge of an external clock signal applied from an external portion during a normal operation including a normal read operation and a normal write operation and for receiving and buffering an address which is sequentially applied at least twice in response to rising and falling edges of the external clock signal during a test operation including a test read operation and a test write operation;
a memory cell array for writing and reading data in at least one cell which the address designates;
a clock signal generating means for receiving the external clock signal to generate first and second clock signals which have the same phase and frequency as the external clock signal during the normal operation and to generate the first clock signal which has the same phase and frequency as the external clock signal and the second clock signal which has the same phase as and a higher frequency than the external clock signal during the test operation;
a data write means for receiving a first predetermined-bit serial input data applied at a first data rate and converting the first predetermined-bit serial input data into a first predetermined-bit parallel input data to be outputted to the memory cell array during the normal write operation, and for receiving and converting a second predetermined-bit serial input data having a second predetermined-bit number that is smaller than a first predetermined-bit number of the first predetermined-bit serial input data into a second predetermined-bit parallel input data, extending the second predetermined-bit parallel input data to the first predetermined-bit number to generate the first predetermined-bit parallel input data, and outputting the first predetermined- bit parallel input data to the memory cell array during the test write operation; and
a data read means for generating a predetermined-bit parallel output data outputted from the memory cell array in response to the first clock signal during the normal and test operations, converting the predetermined-bit parallel output data into serial output data and outputting the serial output data at the first data rate in response to the second clock signal during the normal read operation, and converting the predetermined-bit parallel output data into the serial output data and outputting the serial data at a second data rate in response to the second clock signal during the test read operation.

11. The device of claim 10, wherein the frequency of the external clock signal applied for the normal operation is higher than the frequency of the external clock signal applied for the test operation.

12. The device of claim 11, wherein the clock signal generating means includes
a clock buffer for buffering the external clock signal to generate a buffered clock signal;
a delay locked loop for detecting a phase difference between the external clock signal and the first clock signal to generate a delay clock signal;
a first clock signal generator for generating the delay clock signal as the first clock signal during the normal operation and for delaying the delay clock signal during a predetermined time and then generating the delayed delay clock signal as the first clock signal during the test operation; and
a second clock signal generator for generating the delay clock signal as the second clock signal during the normal operation and for multiplying a frequency of the delay clock signal by a predetermined number to generate the second clock signal,
wherein the predetermined time is identical to a time spent for the second clock signal generator to multiply the frequency of the delay clock signal by the predetermined number to generate the second clock signal.

13. The device of claim 12, wherein the address input means buffers an address which is serially inputted twice to generate first and second addresses in response to a rising edge of the buffered clock signal during the normal operation, buffering an address which is serially inputted twice to generate first and second addresses in response to rising and falling edges of the buffered clock signal during the test operation, and making up one address using the first and second addresses.

14. The device of claim 13, wherein the address input means includes
a first address input buffer for buffering the address to generate the first address in response to the buffered clock signal during the normal operation and the test operation;
a delay for delaying the buffered address during one clock cycle to generate the second address in response to the buffered clock signal during the normal operation; and
a second address input buffer for buffering the address to generate the second address in response to an opposite phase signal of the buffered clock signal during the test operation.

15. The device of claim 13, wherein the data read means includes:
a data read circuit for receiving and outputting the predetermined-bit parallel output data outputted from the memory cell array in response to the first clock signal during the normal read operation and the test read operation; and
a parallel-to-serial converter for converting the predetermined-bit parallel output data outputted from the data read circuit into the serial output data and outputting the serial output data at the first data rate in response to the second clock signal during the normal read operation and the test read operation.

16. The device of claim 11, wherein the data write means includes:
a serial-to-parallel converter for receiving and converting the first predetermined-bit serial input data applied at the first data rate into the first predetermined-bit parallel input data in response to the first clock signal during the normal write operation and for receiving and converting the second predetermined-bit serial input data having the second predetermined-bit number that is smaller than the first predetermined-bit number applied at the first data rate into the second predetermined-bit parallel input data and extending the second predetermined-bit parallel input data to the first predetermined-bit number to generate the first predetermined-bit parallel input data, in response to the second clock signal during the test write operation; and
a data write circuit for writing the first predetermined-bit parallel input data onto the memory cell array in response to the first clock signal during the normal write operation and the test write operation.

17. The device of claim 11, wherein the first data rate is a double data rate, and the second data rate is a quad data rate.

18. The device of claim 17, further comprising, a mode setting means for receiving a code signal applied from an external portion to generate a selection signal for selecting the normal operation or the test operation and a burst length signal for setting the bit number of the predetermined-bit serial input and output data, during a mode setting operation.

19. The device of claim 18, further comprising, an enable clock signal generator for generating a write enable clock signal in response to the second clock signal during the normal write operation and the test write operation and for generating a read enable clock signal for outputting the predetermined-bit serial output data in response to the second clock signal and the burst length signal during the normal read operation and the test read operation.

20. A data write and read method of a semiconductor memory device, comprising:
receiving an external clock signal applied from an external portion;
generating first and second clock signals which have the same phase and frequency as the external clock signal during a normal operation including a normal read operation and a normal write operation and generating the first clock signal which has the same phase and frequency as the external clock signal and the second clock signal which has the same phase as and a higher frequency than the external clock signal during a test operation including a test read operation and a test write operation;
receiving a first predetermined-bit serial input data applied at a first data rate;
converting the first predetermined-bit serial input data into parallel input data to be outputted to the memory cell array during the normal write operation and receiving and converting a second predetermined-bit input serial data into the parallel input data to be outputted to the memory cell array in response to the second clock signal during the test write operation;
reading a predetermined-bit parallel output data outputted from the memory cell array in response to the first clock signal during the normal and test operations;
converting the predetermined-bit parallel output data into serial output data and outputting the serial output data at the first data rate in response to the second clock signal during the normal read operation and converting the predetermined-bit parallel output data into serial output data and outputting the serial output data at a second data rate in response to the second clock signal during the test read operation.

21. The method of claim 20, wherein the frequency of the external clock signal applied for the test operation is lower than the frequency of the external clock signal applied for the normal operation.

22. The method of claim 20, wherein generating first and second clock signals includes:
detecting a phase difference between the external clock signal and the first clock signal to generate a delay clock signal;
generating the delay clock signal as the first clock signal during the normal operation and delaying the delay clock signal during a predetermined time and then generating the delayed delay clock signal as the first clock signal during the test operation; and
generating the delay clock signal as the second clock signal during the normal operation and for multiplying a frequency of the delay clock signal by a predetermined number to generate the second clock signal,
wherein the predetermined time is identical to a time spent to multiply the frequency of the delay clock signal by the predetermined number to generate the second clock signal.

23. The method of claim 20, the predetermined-bit parallel output data being referred to as first predetermined-bit parallel output data, wherein converting the second predetermined-bit serial input data into the parallel input data includes:
during the test write operation, converting the second predetermined-bit serial input data into second predetermined-bit parallel input data to generate the first predetermined-bit parallel input data if a second predetermined-bit number of the second predetermined-bit parallel input data is equal to a first predetermined-bit number of the first predetermined-bit parallel input data, and converting the second predetermined-bit serial input data into parallel input data to generate the first predetermined-bit parallel input data if the second predetermined-bit number is smaller than the first predetermined-bit number during the test write operation.

24. The method of claim 20, wherein the first data rate is a data rate which transmits data of a predetermined times of the second data rate within one cycle of the external clock signal.

25. A data write and read method of a semiconductor memory device, comprising:

receiving and buffering an address which is sequentially applied at least twice in response to a rising edge of an external clock signal applied from an external portion during a normal operation including a normal read operation and a normal write operation and for receiving and buffering an address which is sequentially applied at least twice in response to rising and falling edges of the external clock signal during a test operation including a test read operation and a test write operation;

receiving the external clock signal to generate first and second clock signals which have the same phase and frequency as the external clock signal during the normal operation and to generate the first clock signal which has the same phase and frequency as the external clock signal and the second clock signal which has the same phase as and a higher frequency than the external clock signal during the test operation;

receiving a first predetermined-bit serial input data applied at a first data rate and converting the first predetermined-bit serial input data into parallel input data to be outputted to a memory cell array during the normal write operation and receiving a second predetermined-bit serial input data applied at the first data rate and converting the second predetermined-bit serial input data into the parallel input data to be outputted to the memory cell array in response to the second clock signal during the test write operation;

reading a predetermined-bit parallel output data outputted from the memory cell array in response to the first clock signal during the normal and test operations; and converting the predetermined-bit parallel output data into serial output data and outputting the predetermined-bit serial output data at the first data rate in response to the second clock signal during the normal read operation, and converting the predetermined-bit parallel output data into serial output data and outputting the serial output data at the a second data rate in response to the second clock signal during the test read operation.

26. The method of claim 25, wherein the frequency of the external clock signal applied for the normal operation is higher than the frequency of the external clock signal applied for the test operation.

27. The method of claim 26, wherein receiving a second predetermined-bit serial data includes:

during the test write operation, converting the second predetermined-bit serial input data into the second predetermined-bit parallel input data to generate the first predetermined-bit parallel data if a second predetermined-bit number of the second predetermined-bit parallel input data is equal to a first predetermined-bit number of the first predetermined-bit parallel input data; and converting the second predetermined-bit serial input data into second predetermined-bit parallel input data to generate the first predetermined-bit parallel input data if the second predetermined-bit number is smaller than the first predetermined-bit number during the test write operation.

28. The method of claim 26, wherein the first data rate is a data rate which transmits data of a predetermined times of the second data rate within one cycle of the external clock signal.

29. The method of claim 25, wherein receiving the external clock signal to generate first and second clock signals includes buffering the external clock signal to generate a buffered clock signal;

detecting a phase difference between the external clock signal and the first clock signal to generate a delay clock signal;

a first clock signal generating step for generating the delay clock signal as the first clock signal during the normal operation and for delaying the delay clock signal during a predetermined time and then generating the delayed delay clock signal as the first clock signal during the test operation; and a second clock signal generating step for generating the delay clock signal as the second clock signal during the normal operation and for multiplying a frequency of the delay clock signal by a predetermined number to generate the second clock signal, wherein the predetermined time is identical to a time spent to multiply the frequency of the delay clock signal by the predetermined number to generate the second clock signal at the second clock signal generating step.

30. The device of claim 29, wherein receiving and buffering an address includes buffering an address which is serially inputted twice to generate first and second addresses in response to a rising edge of the buffered clock signal during the normal operation;

buffering an address which is serially inputted twice to generate first and second addresses in response to rising and falling edges of the buffered clock signal during the test operation; and making up one address using the first and second addresses.

31. The method of claim 29, wherein receiving and buffering an address includes buffering the address to generate the first address in response to the buffered clock signal during the normal operation and the test operation;

delaying the buffered address during one clock cycle to generate the second address in response to the buffered clock signal during the normal operation; and buffering the address to generate the second address in response to an opposite phase signal of the buffered clock signal during the test operation.

* * * * *

UNITED STATES PATENT AND TRADEMARK OFFICE
CERTIFICATE OF CORRECTION

| | | |
|---|---|---|
| PATENT NO. | : 7,546,497 B2 | Page 1 of 1 |
| APPLICATION NO. | : 11/419155 | |
| DATED | : June 9, 2009 | |
| INVENTOR(S) | : Seong-Jin Jang | |

It is certified that error appears in the above-identified patent and that said Letters Patent is hereby corrected as shown below:

Column 3, line 23, the word "FIG," should read -- FIG. --;
Column 4, line 21, the word "dim" should read -- di --.

Signed and Sealed this

Twentieth Day of October, 2009

David J. Kappos
*Director of the United States Patent and Trademark Office*